(12) United States Patent
Fargeas et al.

(10) Patent No.: US 9,643,240 B2
(45) Date of Patent: May 9, 2017

(54) SHELL MOULD HAVING A HEAT SHIELD (71) Applicant: SNECMA, Paris (FR)

(72) Inventors: Serge Fargeas, Sacey (FR); Dominique Coyez, Conflans Sainte Honorine (FR)

(73) Assignee: SNECMA, Paris (FR)

( * ) Notice: Subject to any disclaimer, the term of this patent is extended or adjusted under 35 U.S.C. 154(b) by 194 days.

(21) Appl. No.: 14/429,109

(22) PCT Filed: Sep. 16, 2013

(86) PCT No.: PCT/FR2013/052113
§ 371 (c)(1),
(2) Date: Mar. 18, 2015

(87) PCT Pub. No.: WO2014/049223
PCT Pub. Date: Apr. 3, 2014

(65) Prior Publication Data
US 2015/0224568 A1 Aug. 13, 2015

(30) Foreign Application Priority Data

Sep. 25, 2012 (FR) ...................... 12 58966

(51) Int. Cl.
*B22C 9/04* (2006.01)
*B22D 27/04* (2006.01)
(Continued)

(52) U.S. Cl.
CPC ............... *B22C 9/04* (2013.01); *B22C 9/22* (2013.01); *B22D 25/02* (2013.01); *B22D 27/045* (2013.01);
(Continued)

(58) Field of Classification Search
CPC ........... B22C 9/04; B22C 9/22; B22D 27/045; B22D 41/00; B22D 25/02; B22D 30/00
See application file for complete search history.

(56) References Cited

U.S. PATENT DOCUMENTS 5,072,771 A * 12/1991 Prasad ................. B22D 27/045
164/122.1
2004/0163790 A1 8/2004 Boswell
2006/0157220 A1 7/2006 Boswell

FOREIGN PATENT DOCUMENTS

CN 1550272 A 12/2004
CN 102166643 A 8/2011
(Continued)

OTHER PUBLICATIONS

Office Action issued on Nov. 3, 2015 in Chinese Patent Application No. 201380046069.7 (submitting English language translation only).

(Continued)

*Primary Examiner* — Kevin P Kerns
*Assistant Examiner* — Steven Ha
(74) *Attorney, Agent, or Firm* — Oblon, McClelland, Maier & Neustadt, L.L.P.

(57) ABSTRACT

A field of casting, and more particularly to a shell mold, and also to methods of fabricating and using such a shell mold. This shell mold includes a central cylinder, a plurality of molding cavities arranged in an assembly around the central cylinder, and at least one heat shield that is substantially perpendicular to the main axis. The central cylinder extends along a main axis between a casting cup and a base. Each molding cavity is connected to the casting cup by at least one feed channel, and also, by a baffle-selector with a starter in the base. The at least one heat shield completely surrounds each molding cavity in a plane that is substantially perpendicular to the main axis.

7 Claims, 6 Drawing Sheets

(51) Int. Cl.
*C30B 11/00* (2006.01)
*C30B 29/52* (2006.01)
*B22C 9/22* (2006.01)
*B22D 25/02* (2006.01)
*B22D 30/00* (2006.01)
*B22D 41/00* (2006.01)

(52) U.S. Cl.
CPC ............ *B22D 30/00* (2013.01); *B22D 41/00* (2013.01); *C30B 11/003* (2013.01); *C30B 29/52* (2013.01)

(56) References Cited

FOREIGN PATENT DOCUMENTS

| | | |
|---|---|---|
| EP | 1 452 251 | 9/2004 |
| FR | 2 874 340 | 2/2006 |

OTHER PUBLICATIONS

International Search Report Issued Apr. 29, 2014 in PCT/FR2013/052113 Filed Sep. 16, 2013.

* cited by examiner

SHELL MOULD HAVING A HEAT SHIELD

BACKGROUND OF THE INVENTION

The present invention relates to the field of casting, and more particularly to a shell mold, and to methods of manufacturing and using such a shell mold.

So-called "lost-wax" or "lost-pattern" casting methods have been known since antiquity. They are particularly suitable for producing metal parts that are complex in shape. Thus, lost-pattern casting is used in particular for producing turbine engine blades.

In lost-pattern casting, the first step normally comprises making a pattern out of a material having a melting temperature that is comparatively low, such as for example out of wax or resin, and then overmolding the mold onto the pattern. After removing the material of the pattern from the inside of the mold, whence the name of such methods, molten metal is cast into the mold in order to fill the cavity that the pattern has formed inside the mold by being removed therefrom. Once the metal has cooled and solidified, the mold may be opened or destroyed in order to recover a metal part having the shape of the pattern.

In order to be able to make a plurality of parts simultaneously, it is possible to unite a plurality of patterns in a single assembly in which they are connected together by a tree that forms casting channels in the mold for the molten metal.

Among the various types of mold that can be used in lost-pattern casting, so-called "shell" molds are known that are formed by dipping the pattern or the assembly of patterns into a slip, and then dusting refractory sand onto the pattern or the assembly of patterns coated in the slip in order to form a shell around the pattern or the assembly, and then baking the shell in order to solidify the slip and thus consolidate the slip and the sand. Several successive operations of dipping and dusting may be envisaged in order to obtain a shell of sufficient thickness prior to baking it. The term "refractory sand" is used in the present context to designate any granular material of grain size that is small enough to satisfy the desired production tolerances, that is capable, while in the solid state, of withstanding the temperature of the molten metal, and that is capable of being consolidated into a single solid piece by the slip during baking of the shell.

The term "metal" is used in the present context to designate both pure metals and metal alloys, and in particular metal alloys known as monocrystalline alloys such as those developed since the end of 1970s in order to enable parts to be cast in the form of a single grain. Conventional metal alloys are equiaxed polycrystallines: in their solid state, they form a plurality of grains of substantially identical size, typically about 1 millimeter (mm), but of more or less random orientation. The boundaries between grains constitute weak points in a metal part made out of such an alloy. However, using additives to strengthen these inter-grain boundaries presents the drawback of reducing the melting point temperature, which is a disadvantage, particularly when the parts produced in this way are for use at high temperature. Typically, monocrystalline alloys are nickel alloys with a concentration of titanium and/or aluminum that is lower than 10 molar percent (% mol). Thus, after solidifying, these alloys form two-phase solids, with a γ first phase and a γ' second phase. The γ phase presents a face-centered cubic crystal lattice, in which the nickel, aluminum, and/or titanium atoms may occupy any position. In contrast, in the γ' phase, the aluminum, and/or titanium atoms form a cubic configuration, occupying the eight corners of the cube, while the nickel atoms occupy the faces of the cube.

One of these alloys is the nickel alloy "AM1" developed jointly by SNECMA and the ONERA laboratories, the Ecole des Mines in Paris, and IMPHY SA. Parts made of such an alloy can not only achieve mechanical strength that is particularly high along all stress axes, but can also achieve improved thermal resistance, since additives for binding the crystalline grains together more strongly may be omitted. Thus, metal parts made of such monocrystalline alloys may advantageously be used, e.g. in the hot parts of turbines.

Nevertheless, in order to benefit fully from the advantages of monocrystalline alloys in order to obtain advantageous thermomechanical properties in a part made by casting, it may be desirable to ensure that the metal undergoes directional solidification in the mold. The term "directional solidification" is used in the present context to mean that control is exerted over the nucleation and the growth of solid crystals in the molten metal as it passes from the liquid state to the solid state. The purpose of such directional solidification is to avoid the negative effects of grain boundaries within the part. Thus, the directional solidification may be columnar or monocrystalline. Columnar directional solidification consists in orienting all of the grain boundaries in the same direction so that they cannot contribute to propagating cracks. Monocrystalline directional solidification consists in ensuring that the part solidifies as a single crystal, so as to eliminate all grain boundaries.

The published specification of French patent application FR 2 874 340 describes a shell mold that is particularly adapted to implementing a casting method with directional solidification. That shell mold of the prior art includes a central cylinder extending, along a main axis, between a casting cup and a base, and a plurality of molding cavities arranged as an assembly around the central cylinder, each one connected to the casting cup by a feed channel. In order to enable directional solidification of molten metal in the molding cavities, each of them is also connected via a baffle-selector to a starter adjacent to the base. Furthermore, the shell mold also includes at least one heat shield that is substantially perpendicular to said main axis.

In a casting method using said shell mold, after casting the molten metal through the casting cup, the molten metal is cooled progressively, along said main axis from the base towards the casting cup. By way of example, this may be performed by gradually extracting the shell mold from a heater chamber, along the main axis, towards the base, while cooling the base.

Because the molten metal is cooled progressively going away from the plate, the first solid grains nucleate in the starters adjacent to the plate. The configuration of the baffle-selectors then prevents propagation of more than a single grain towards each molding cavity.

The purpose of using at least one heat shield is to try to ensure that the propagation front of the crystallization in each molding cavity remains substantially perpendicular to the main axis. A sloping propagation front would be likely to cause unwanted grains to nucleate in the molding cavity. However, it is nevertheless found to be difficult to prevent such sloping, in particular in molding cavities that are complex in shape.

OBJECT AND SUMMARY OF THE INVENTION

The invention seeks to overcome those drawbacks, and in particular to provide a shell mold that makes it possible to ensure directional solidification of the molten metal in the molding cavities of the shell mold, and to do so in a general manner.

In at least one embodiment, this object is reached by means of the fact that at least one heat shield completely surrounds each molding cavity in a plane that is substantially perpendicular to said main axis.

By means of these provisions, it is possible to obtain temperatures that are substantially uniform over the periphery of each molding cavity in each plane that is perpendicular to the main axis, thus contributing to maintaining the orientation of the propagation front of the crystallization inside the molding cavity in such a manner as to avoid unwanted grains forming.

In order to maintain the orientation of the propagation front in each molding cavity, in particular when they are relatively long, the shell mold may comprise at least two heat shields that are substantially perpendicular to said first direction, with an offset between them in said first direction, and each completely surrounding each said molding cavity in a plane that is substantially perpendicular to said main axis. In order to facilitate production of the shell mold, these heat shields may, in particular, be substantially identical, i.e. sufficiently similar as to be interchangeable.

The at least one heat shield may include stiffeners so as to support it in the direction of the main axis of the shell mold. In order to adapt the molding cavities, the at least one heat shield may present a through orifice around each molding cavity.

The base of the shell mold may form a plate for supporting it and also for providing a metal that is cast into the shell mold with good thermal contact with a cooled soleplate under the shell mold. This then enables the metal to be cooled from below while the shell mold is being extracted from a heater chamber, so as to ensure directional solidification of the molten metal inside the shell mold. Furthermore, the shell mold may also include additional stiffeners, connecting the molding cavities to a tip of the casting cup.

The present invention also provides a method of fabricating such a shell mold, and in particular a method comprising: making a non-permanent assembly comprising a plurality of models connected together by a tree; dipping the assembly in a slip; dusting the slip-coated assembly with refractory sand to form a shell around the assembly; removing the assembly; and baking the shell. The steps of dipping and dusting may be repeated several times in order to obtain a desired thickness of the shell. The non-permanent assembly may be removed in conventional manner by melting the material of the assembly, said material having a melting point that is comparatively low.

In particular, in order to facilitate forming each heat shield, each heat shield may also be formed around a non-permanent disk, e.g. made out of a material having a low melting point, like the assembly.

The present invention also relates to a casting method using such a shell mold and comprising: casting molten metal into the shell mold through the casting cup; and progressively cooling the molten metal along said main axis, from the base towards the casting cup. In particular, the step of progressively cooling the molten metal is performed by gradually extracting the shell mold from a heater chamber, along the main axis, in the direction of the plate, while cooling the base.

BRIEF DESCRIPTION OF THE DRAWINGS

The invention can be well understood and its advantages appear better on reading the following detailed description of an embodiment given by way of non-limiting example. The description refers to the accompanying drawings, in which.

DETAILED DESCRIPTION OF THE INVENTION

Figure 1:
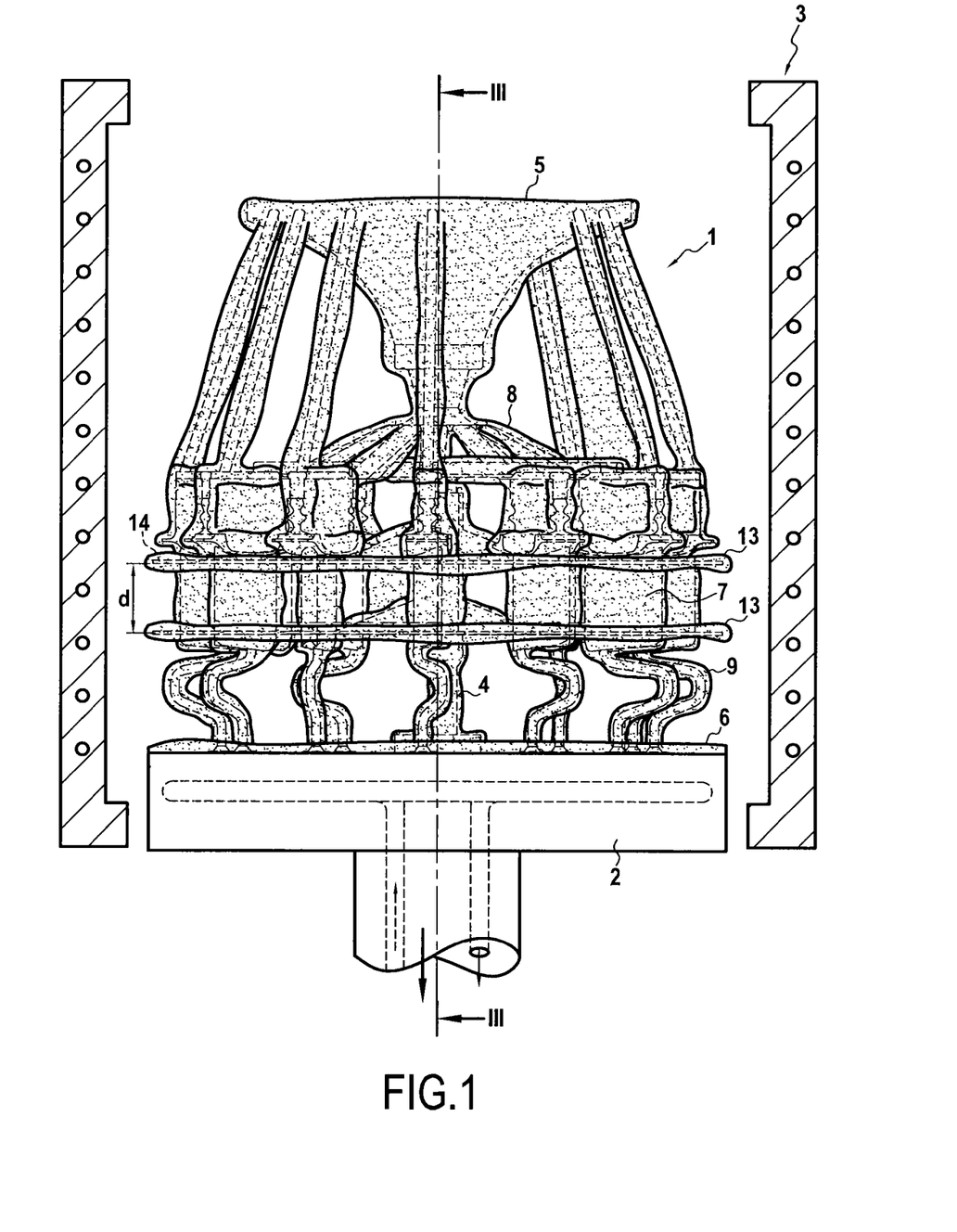
FIG. 1 is a diagram showing a step of progressively cooling molten metal in a directional solidification casting method.

FIG. 1 shows how progressive cooling of molten metal in order to obtain directional solidification can typically be performed in a casting method. In this progressive cooling step, following casting of the molten metal into a shell mold 1, said shell mold 1, supported by a cooled and movable support 2 is extracted from a heater chamber 3 downwards along a main axis X.

The shell mold 1 comprises a central cylinder 4 extending along the main axis X between a casting cup 5 and a plate-shaped base 6. During removal of the shell mold 1 from the heater chamber 3, this base 6 is directly in contact with the support 2. The shell mold 1 also includes a plurality of molding cavities 7 arranged as an assembly around the central cylinder 4. Each molding cavity 7 is connected to the casting cup 5 by a feed channel 8 through which the molten metal was introduced during casting. Each molding cavity 7 is also connected at the bottom via a baffle-selector 9 to a starter 10 formed by a smaller cavity in the base 6.

Since the shell mold 1 is cooled via its base 6 by the support 2, the solidification of the molten metal is triggered in the starters 10 and it propagates upwards during the progressive downward extraction of the shell mold 1 from the heater chamber 3. The constriction formed by each selector 9, and also its baffle shape, nevertheless serve to ensure that only one of the grains that nucleates initially in each of the starters 10 is capable of continuing so as to extend to the corresponding mold cavity 7.

Figure 2A:
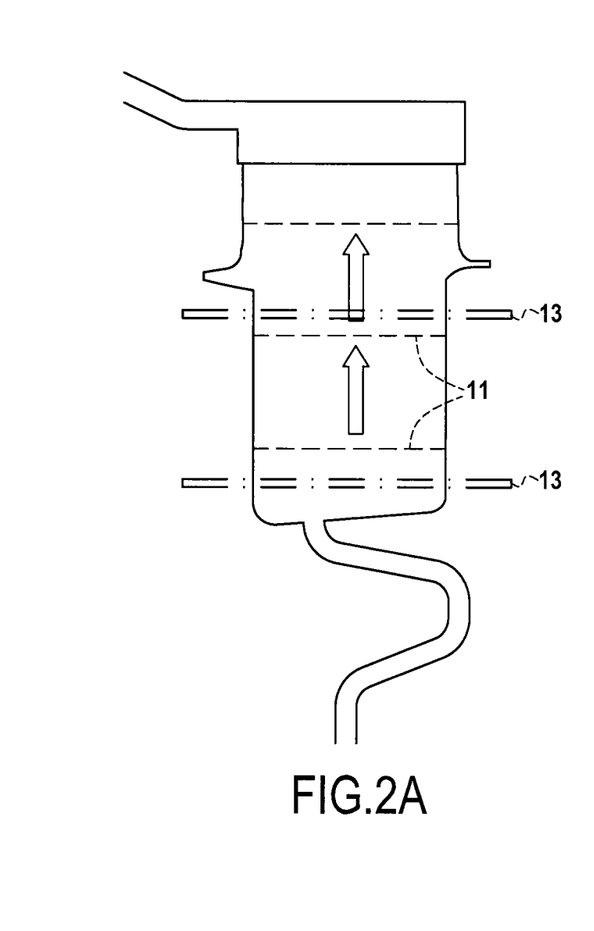
FIGS. 2A and 2B show, respectively, a desirable progression and a non-desirable progression of the propagation front of the crystallization of the metal in a molding cavity during the progressive cooling of FIG. 1.
Figure 2B:
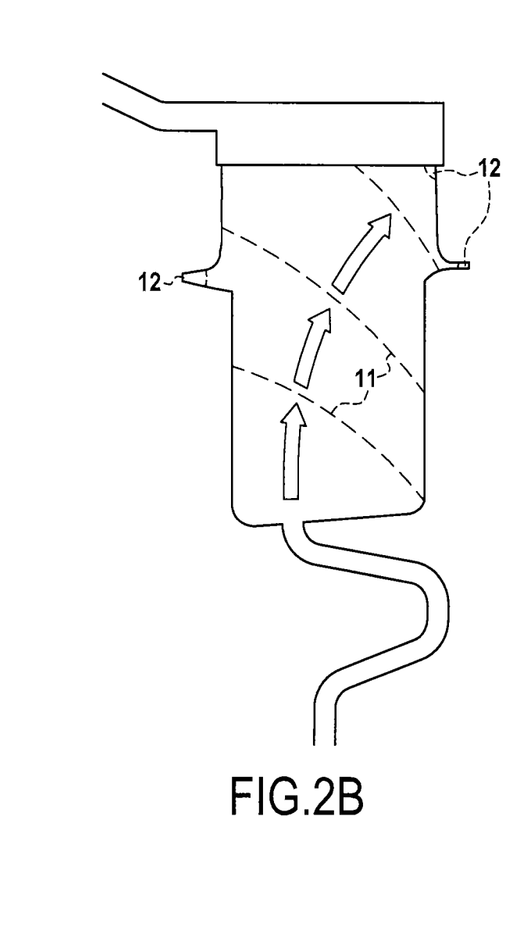

FIG. 2A shows the desirable progression of the propagation front 11 of the crystallization of molten metal in a molding cavity 7 in the shape of a turbine engine fan blade. In order to obtain a monocrystalline turbine engine blade, it is desirable for said crystallization to advance in regular manner along the main axis of the molding cavity 7. In contrast, if the propagation front 11 is sloping while it is advancing into the molding cavity 7, as shown by way of comparison in FIG. 2B, the risk of generating unwanted grains 12 in certain areas of the molding cavity 7 increases substantially. Unfortunately, temperature gradients perpendicular to the main axis of the molding cavity 7 can easily cause the propagation front 11 to slope in this way. It is thus desirable in particular to control the way heat is radiated from the various elements of the shell mold 1.

Figure 3:
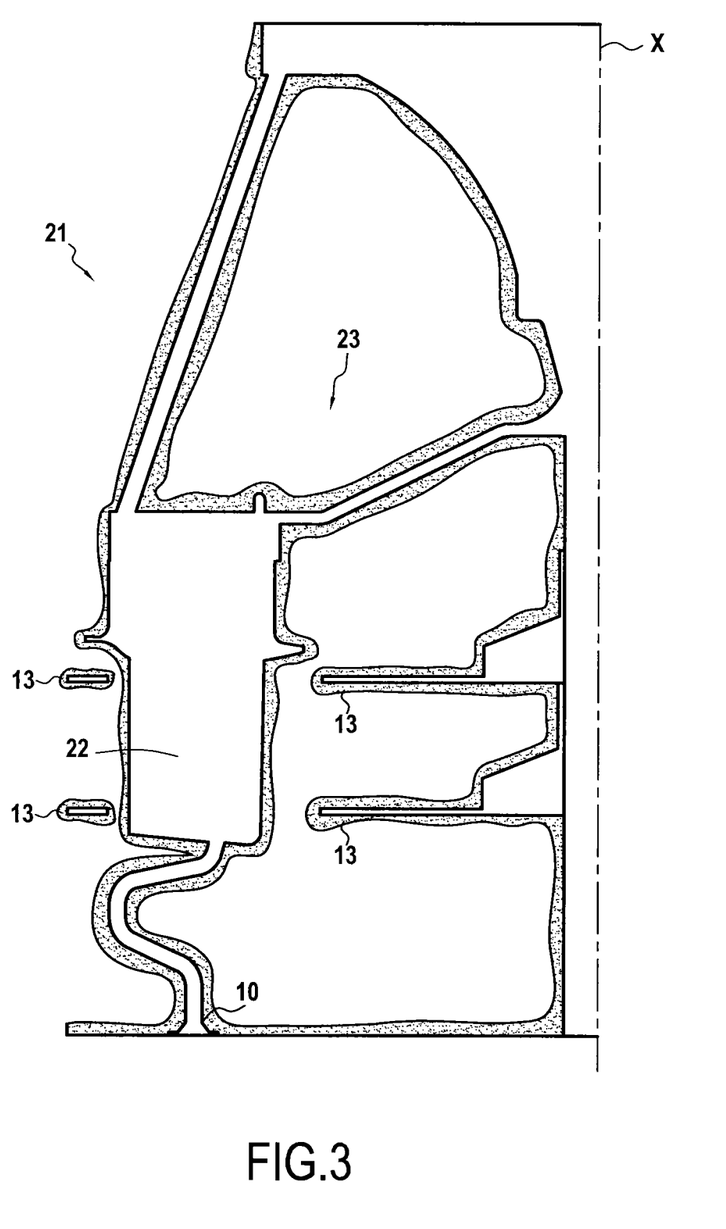
FIG. 3 is a longitudinal section view of a shell mold in an embodiment of the invention.
Figure 4:
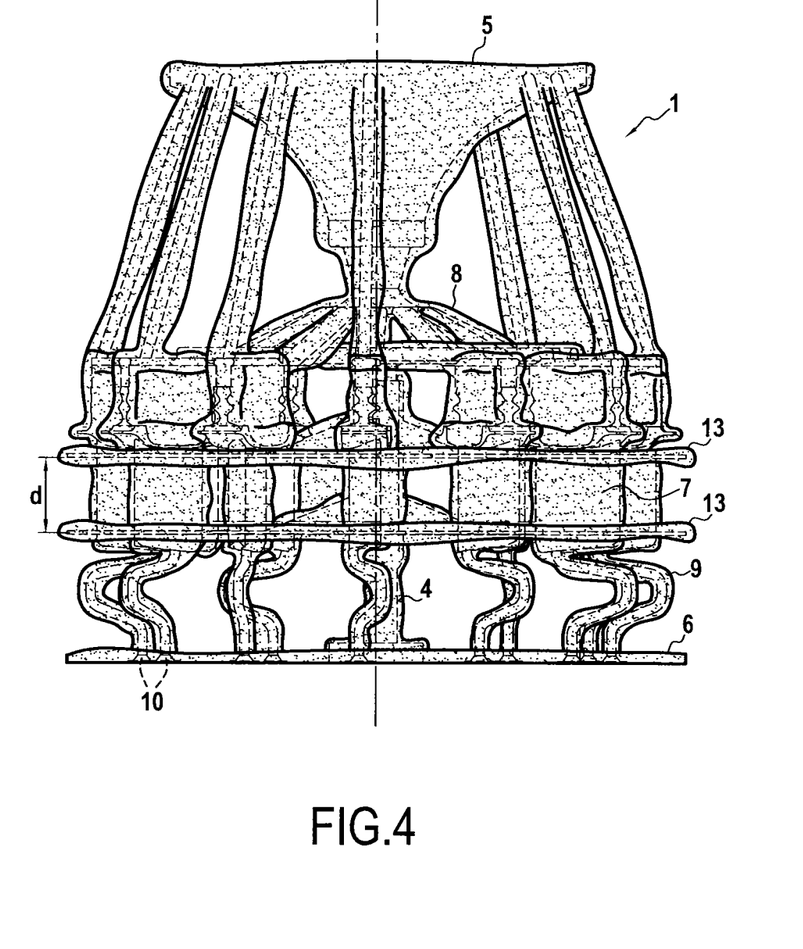
FIG. 4 is a side view of the shell mold of FIG. 3.

FIGS. 3 and 4 show a shell mold 1 in an embodiment of the invention. This shell mold 1 includes two heat shields 13 that extend perpendicularly to the main axis X starting from the central cylinder 4. The two heat shields 13 are situated at the height of the molding cavities 7 with a longitudinal offset d along the main axis X. The diameter of each of the two heat shields 13 is such that they extend radially beyond the walls of each molding cavity 7. Thus, each heat shield 13 completely surrounds each molding cavity 7 in a transverse plane that is perpendicular to the main axis X. However, to prevent heat being conducted directly between the walls of the molding cavity 7 and the heat shield 13, a transverse gap may separate said walls from each heat shield 13 in said transverse plane all around each molding cavity.

Figure 5:
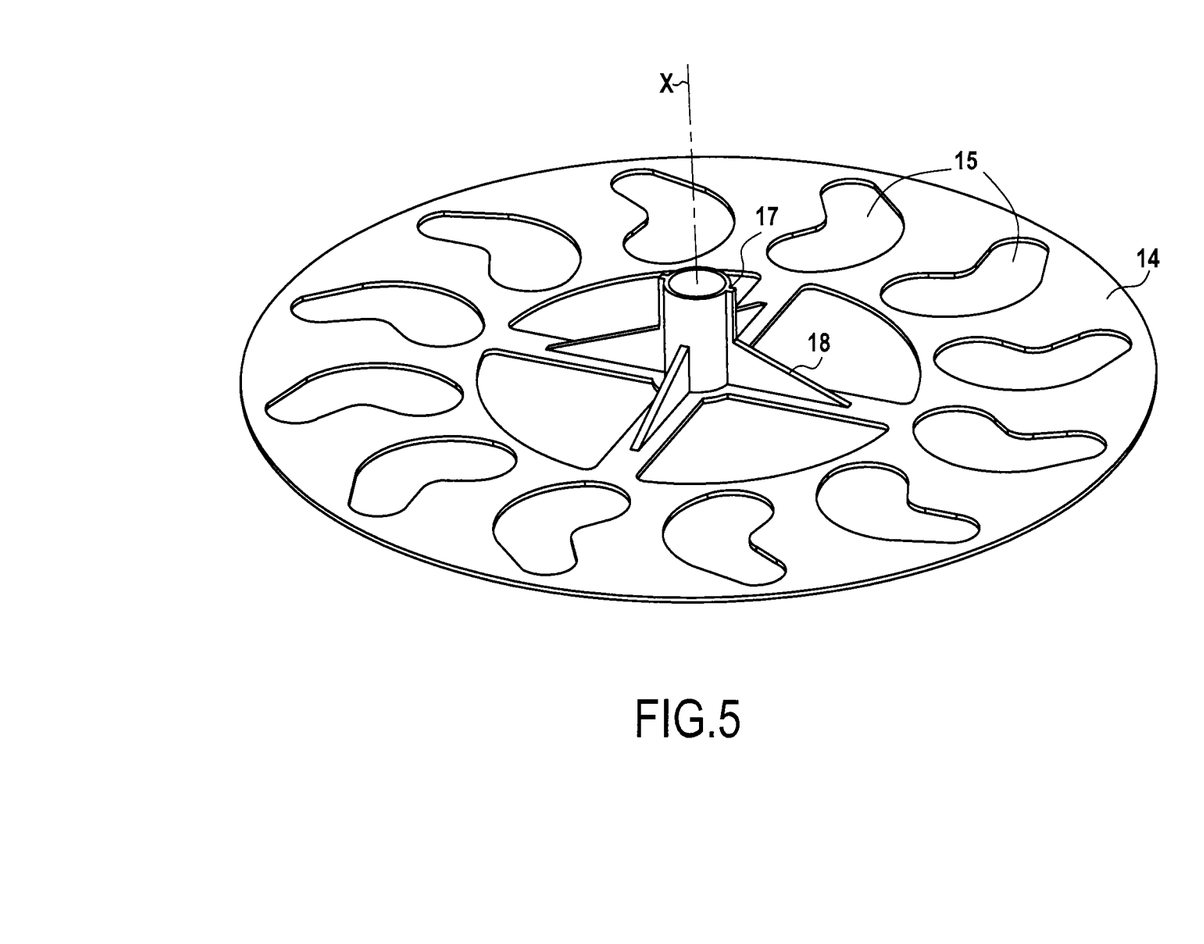
FIG. 5 is a perspective view of a non-permanent core for forming a heat shield of the shell mold of FIGS. 3 and 4.

In the embodiment shown, each heat shield 13 was formed around a disk 14 made of wax, such as that shown in FIG. 5. The two disks 14 may be substantially identical. The disk 14 shown presents a plurality of through orifices 15, each corresponding to a molding cavity 7, a central cylinder with a positioning and holding spline 17, and webs 18 extending radially, and perpendicularly to the transverse plane in order to form stiffeners for ensuring that each heat shield 13 is rigid along the main axis X.

The base 6 of the shell mold 1 is plate-shaped. Furthermore, stiffeners 20 in the shape of sloping columns connect the top of each molding cavity 7 to that of the casting cup 5.

Figure 6:
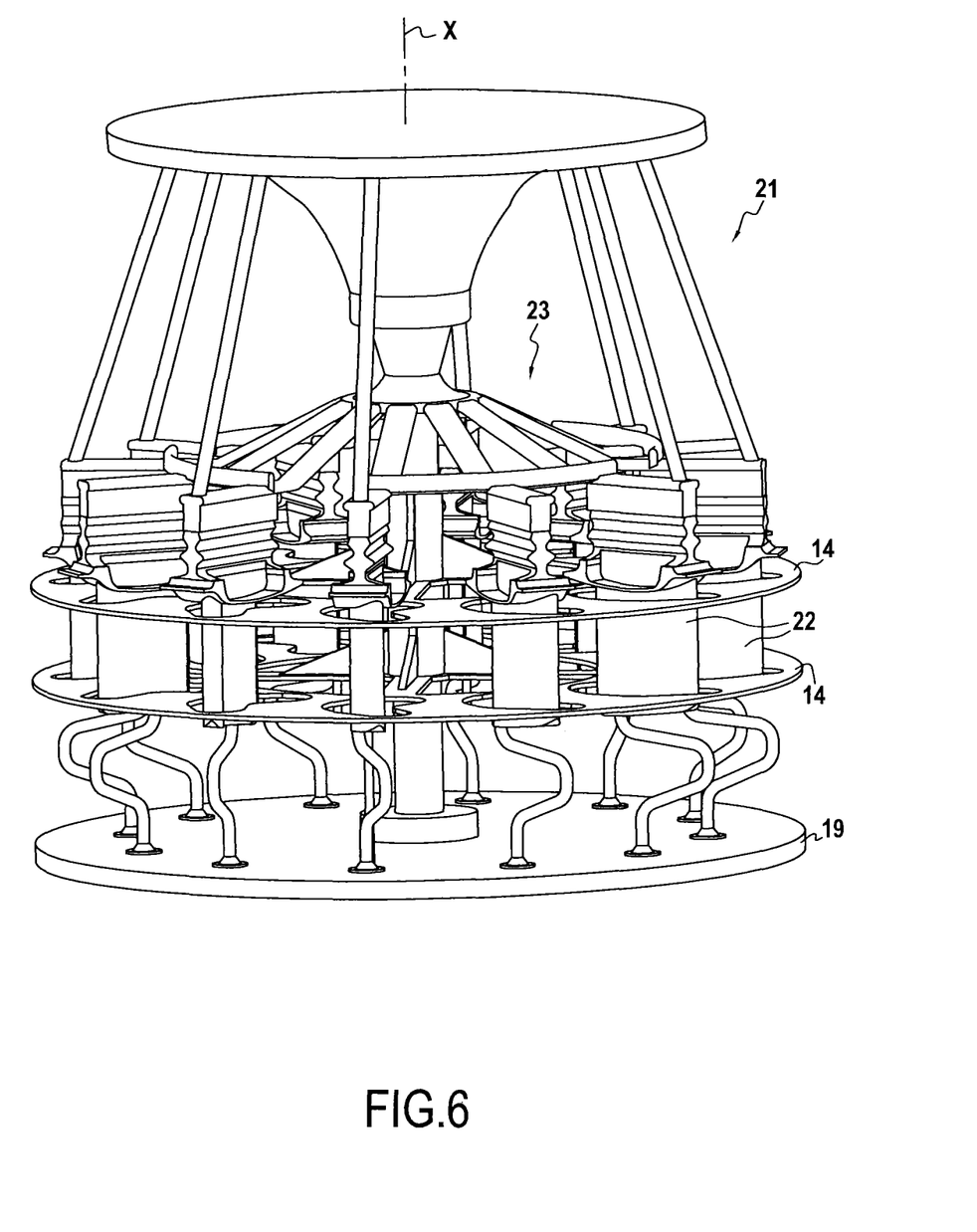
FIG. 6 is a perspective view of a non-permanent assembly that is used to form the shell mold of FIGS. 3 and 4.

The shell mold 1 may be produced by the so-called "lost-wax" or "lost-pattern" method. A first step of such a method is creating a non-permanent assembly 21 comprising a plurality of patterns 22 connected together by a tree 23, as shown in FIG. 6. The parts of the tree 23 for forming hollow volumes in the shell mold 1, such as in particular the casting cup 5, the feed channels 8, the stiffeners 20, the selectors 9, the heat shields 13, and the starters 10 are made of a material having a low melting point, such as a modeling wax or resin. The models 22, that are to form the molding cavities 7, are made of a material having a low melting point. When it is intended to produce large numbers of parts, it is possible in particular to produce these elements by injecting the patterning resin or wax into a permanent mold. By means of the positioning and holding spline 17, each disk 14 can be correctly positioned, with its orifices 15 in alignment with the models 22.

In this implementation, in order to produce the shell mold 1 from the non-permanent assembly 21, the assembly 21 is dipped in a slip, and then dusted with refractory sand. These dipping and dusting steps may be repeated several times, until a shell of slip-impregnated sand of desired thickness has been formed around the assembly 21.

The assembly 21 covered in this shell can then be heated so as to melt the low melting-temperature material of the assembly 21 and remove it from the inside of the shell. Thereafter, in a higher temperature baking step, the slip is solidified so as to consolidate the refractory sand and form the shell mold 1 of FIGS. 3 and 4.

The shell mold 1 can then be used in a casting method in which molten metal is initially cast in the shell mold 1 through the casting cup 5, so as to then be subjected to directional solidification in the manner shown in FIG. 1. The metal alloys that are suitable for use in this method include in particular monocrystalline nickel alloys such as in particular AM1 and AM3 from Snecma, and also other alloys such as CMSX-2®, CMSX-4®, CMSX-6®, and CMSX-10® from C-M Group, René® N5 and N6 from General Electric, RR2000 and SRR99 from Rolls-Royce, and PWA 1480, 1484, and 1487 from Pratt & Whitney, amongst others. Table 1 summarizes the compositions of these alloys:

TABLE 1

Monocrystalline nickel alloys in weight percentages

| Alloy | Cr | Co | Mo | W | Al | Ti | Ta | Nb | Re | Hf | C | B | Ni |
|---|---|---|---|---|---|---|---|---|---|---|---|---|---|
| CMSX-2 | 8.0 | 5.0 | 0.6 | 8.0 | 5.6 | 1.0 | 6.0 | — | — | — | — | — | Bal |
| CMSX-4 | 6.5 | 9.6 | 0.6 | 6.4 | 5.6 | 1.0 | 6.5 | — | 3.0 | 0.1 | — | — | Bal |
| CMSX-6 | 10.0 | 5.0 | 3.0 | — | 4.8 | 4.7 | 6.0 | — | — | 0.1 | — | — | Bal |
| CMSX-10 | 2.0 | 3.0 | 0.4 | 5.0 | 5.7 | 0.2 | 8.0 | — | 6.0 | 0.03 | — | — | Bal |
| René N5 | 7.0 | 8.0 | 2.0 | 5.0 | 6.2 | — | 7.0 | — | 3.0 | 0.2 | — | — | Bal |
| René N6 | 4.2 | 12.5 | 1.4 | 6.0 | 5.75 | — | 7.2 | — | 5.4 | 0.15 | 0.05 | 0.004 | Bal |
| RR2000 | 10.0 | 15.0 | 3.0 | — | 5.5 | 4.0 | — | — | — | — | — | — | Bal |
| SRR99 | 8.0 | 5.0 | — | 10.0 | 5.5 | 2.2 | 12.0 | — | — | — | — | — | Bal |
| PWA1480 | 10.0 | 5.0 | — | 4.0 | 5.0 | 1.5 | 12.0 | — | — | — | 0.07 | — | Bal |
| PWA1484 | 5.0 | 10.0 | 2.0 | 6.0 | 5.6 | — | 9.0 | — | 3.0 | 0.1 | — | — | Bal |
| PWA1487 | 5.0 | 10.0 | 1.9 | 5.9 | 5.6 | — | 8.4 | — | 3.0 | 0.25 | — | — | Bal |
| AM1 | 7.0 | 8.0 | 2.0 | 5.0 | 5.0 | 1.8 | 8.0 | 1.0 | — | — | — | — | Bal |
| AM3 | 8.0 | 5.5 | 2.25 | 5.0 | 6.0 | 2.0 | 3.5 | — | — | — | — | — | Bal |

After the metal has cooled and solidified in the shell mold, the mold can be knocked out so as to release the metal parts, which can then be finished by machining and/or surface treatment methods.

Although the present invention is described with reference to a specific embodiment, it is clear that various modifications and changes may be made thereto without going beyond the general ambit of the invention as defined by the claims. Consequently, the description and the drawings should be considered in an illustrative sense rather than in a restrictive sense.

The invention claimed is:

1. A shell mold comprising:
    a central cylinder extending, along a main axis, between a casting cup and a base;
    a plurality of molding cavities arranged as a cluster around the central cylinder, each one being connected to the casting cup by at least a feed channel, and via a baffle-selector to a starter in the base;
    at least one heat shield that is substantially perpendicular to said main axis;
    wherein said at least one heat shield completely surrounds each said molding cavity in a plane that is substantially perpendicular to said main axis; and
    wherein said at least one heat shield presents a through orifice around each molding cavity.

2. A shell mold according to claim 1, comprising at least two heat shields that are substantially perpendicular to said main axis, with an offset between them in the direction of said main axis, and each completely surrounding each said molding cavity in a plane that is substantially perpendicular to said main axis.

3. A shell mold according to claim 1, wherein said at least one heat shield includes stiffeners.

4. A method of fabricating a shell mold according to claim 1, comprising the following steps:
- making a non-permanent cluster comprising a plurality of models connected by a tree;
- dipping the cluster in a slip;
- dusting the slip-coated cluster with refractory sand in order to form a shell around the cluster;
- removing the cluster; and
- baking the shell.

5. A method of fabricating a shell mold in accordance with claim 4, wherein each heat shield is formed around a non-permanent disk.

6. A casting method using a shell mold according to claim 1, comprising the following steps:
- casting molten metal into the shell mold through the casting cup; and
- progressively cooling the molten metal along said main axis, from the base towards the casting cup.

7. A method according to claim 6, wherein the step of progressively cooling the molten metal is performed by gradually extracting the shell mold from a heater chamber, along the main axis, in the direction of the base, while cooling the base.

* * * * *